United States Patent
Baek et al.

(10) Patent No.: US 11,315,841 B2
(45) Date of Patent: Apr. 26, 2022

(54) PATTERN DESIGN FOR INTEGRATED CIRCUITS AND METHOD FOR INSPECTING THE PATTERN DESIGN FOR INTEGRATED CIRCUITS

(71) Applicant: SAMSUNG ELECTRONICS CO., LTD., Suwon-si (KR)

(72) Inventors: Jong Soo Baek, Hwaseong-si (KR); Jin Myoung Lee, Hwaseong-si (KR); Min Soo Kang, Hwaseong-si (KR); Hyun Ah Roh, Hwaseong-si (KR); Bo Young Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 203 days.

(21) Appl. No.: 16/596,657

(22) Filed: Oct. 8, 2019

(65) Prior Publication Data

US 2020/0335407 A1   Oct. 22, 2020

(30) Foreign Application Priority Data

Apr. 18, 2019 (KR) .................. 10-2019-0045659

(51) Int. Cl.
*H01L 21/66* (2006.01)
*G01R 31/28* (2006.01)
*G01N 23/2251* (2018.01)
*H01L 23/528* (2006.01)

(52) U.S. Cl.
CPC ......... *H01L 22/34* (2013.01); *G01N 23/2251* (2013.01); *G01R 31/2884* (2013.01); *H01L 23/528* (2013.01)

(58) Field of Classification Search
None
See application file for complete search history.

(56) References Cited

U.S. PATENT DOCUMENTS 3,983,479 A * 9/1976 Lee .................. G01R 31/2853
324/537
5,686,762 A * 11/1997 Langley .................. H01L 24/05
257/775
5,754,432 A * 5/1998 Komatsuzaki .......... H01L 22/20
700/110

(Continued)

FOREIGN PATENT DOCUMENTS

JP    2006-222207 A    8/2006
JP    2010003832 A     1/2010

*Primary Examiner* — Erik T. K. Peterson
(74) *Attorney, Agent, or Firm* — Volentine, Whitt & Francos, PLLC

(57) ABSTRACT

A pattern design for defect inspection, the pattern design including a first floating conductive line; a second floating conductive line; and a grounded conductive line disposed between the first floating conductive line and the second floating conductive line. The first floating conductive line, the second floating conductive line, and the grounded conductive line are divided into a main pad region, a plurality of subregions, a plurality of sub-pad regions, and a ground region. The main pad region is positioned at a first end portion of the pattern design. The ground region is positioned at a second end portion of the pattern design. The plurality of subregions and the plurality of sub-pad regions are positioned between the main pad region and the ground region.

16 Claims, 9 Drawing Sheets

(56) References Cited

U.S. PATENT DOCUMENTS

| | | | |
|---|---|---|---|
| 5,872,018 A * | 2/1999 | Lee | H01L 22/34 438/18 |
| 6,181,016 B1 * | 1/2001 | Lin | H01L 24/05 257/758 |
| 6,261,956 B1 * | 7/2001 | Shields | H01L 22/34 438/14 |
| 6,268,717 B1 * | 7/2001 | Jarvis | H01L 22/34 324/750.02 |
| 6,294,397 B1 | 9/2001 | Jarvis et al. | |
| 6,297,644 B1 * | 10/2001 | Jarvis | G01R 31/306 324/537 |
| 6,306,750 B1 * | 10/2001 | Huang | H01L 24/03 257/E21.508 |
| 6,313,540 B1 * | 11/2001 | Kida | H01L 24/03 257/784 |
| 6,362,634 B1 | 3/2002 | Jarvis et al. | |
| 6,452,412 B1 * | 9/2002 | Jarvis | G01R 31/2831 324/750.3 |
| 6,600,333 B1 * | 7/2003 | Martin | G01R 31/2884 324/679 |
| 6,909,188 B2 * | 6/2005 | Akiyama | H01L 21/76802 257/750 |
| 6,921,672 B2 | 7/2005 | Satya et al. | |
| 7,154,115 B2 | 12/2006 | Stine et al. | |
| 7,176,675 B1 | 2/2007 | Liegl | |
| 7,187,179 B1 * | 3/2007 | Scaman | G01R 31/2884 257/18 |
| 7,592,827 B1 * | 9/2009 | Brozek | G01R 31/2853 324/762.01 |
| 7,692,315 B2 * | 4/2010 | Watanabe | H01L 24/05 257/781 |
| 7,705,621 B2 | 4/2010 | Lee et al. | |
| 7,733,099 B2 | 6/2010 | Bae et al. | |
| 8,350,583 B2 | 1/2013 | Cote et al. | |
| 8,395,403 B2 | 3/2013 | Ukai | |
| 9,435,852 B1 | 9/2016 | Kim et al. | |
| 9,496,119 B1 * | 11/2016 | De | H01J 37/28 |
| 10,978,438 B1 * | 4/2021 | Lam | G06F 30/398 |
| 2002/0089345 A1 * | 7/2002 | Doong | H01L 22/34 324/756.03 |
| 2002/0187582 A1 * | 12/2002 | Satya | H01L 23/544 438/48 |
| 2003/0020497 A1 * | 1/2003 | Song | G01R 31/2853 324/719 |
| 2003/0080766 A1 * | 5/2003 | Fetterman | H01L 23/544 324/719 |
| 2003/0096436 A1 | 5/2003 | Satya et al. | |
| 2003/0186473 A1 * | 10/2003 | Rumsey | H01L 22/34 438/18 |
| 2003/0197523 A1 * | 10/2003 | Hamamura | G01R 31/2818 324/762.05 |
| 2004/0075458 A1 * | 4/2004 | Rashkovan | G01R 31/311 324/754.22 |
| 2004/0121497 A1 * | 6/2004 | Ben-Porath | G01N 23/2258 438/14 |
| 2004/0178787 A1 * | 9/2004 | Liu | G01R 31/31723 324/756.05 |
| 2004/0207414 A1 * | 10/2004 | Verma | G01R 31/307 324/754.22 |
| 2005/0017746 A1 * | 1/2005 | Matsumoto | G01R 31/2884 324/762.03 |
| 2005/0122123 A1 | 6/2005 | Stine et al. | |
| 2006/0105475 A1 * | 5/2006 | Ciplickas | H01L 22/20 438/14 |
| 2006/0192904 A1 * | 8/2006 | Almogy | G01N 21/956 349/6 |
| 2007/0132445 A1 * | 6/2007 | Liegl | G01R 31/2856 324/762.01 |
| 2007/0145364 A1 * | 6/2007 | Park | H01L 22/32 257/48 |
| 2007/0296447 A1 | 12/2007 | Bae et al. | |
| 2008/0061436 A1 * | 3/2008 | Yang | H01L 24/11 257/738 |
| 2008/0084223 A1 | 4/2008 | Lee et al. | |
| 2008/0122476 A1 * | 5/2008 | Wang | G01R 31/2858 324/762.05 |
| 2008/0224134 A1 * | 9/2008 | Bae | H01L 22/34 257/48 |
| 2008/0237487 A1 * | 10/2008 | Pinto | H01L 22/34 250/492.1 |
| 2009/0152595 A1 * | 6/2009 | Kaga | G01R 31/307 257/208 |
| 2009/0153174 A1 * | 6/2009 | Wu | G11C 29/04 324/762.05 |
| 2010/0201395 A1 | 8/2010 | Ukai | |
| 2011/0037493 A1 | 2/2011 | Cote et al. | |
| 2011/0062976 A1 * | 3/2011 | Guo | G01R 31/2884 324/754.03 |
| 2011/0101347 A1 * | 5/2011 | Henderson | H01L 22/34 257/48 |
| 2012/0319716 A1 * | 12/2012 | Cote | G01R 31/2884 324/755.01 |
| 2016/0306009 A1 | 10/2016 | Gao et al. | |
| 2016/0314572 A1 | 10/2016 | Fang | |
| 2017/0176358 A1 * | 6/2017 | Yeh | G01R 31/307 |
| 2018/0218987 A1 * | 8/2018 | Watanabe | H01L 24/05 |
| 2019/0080971 A1 * | 3/2019 | Hsu | G01R 31/2853 |
| 2020/0043815 A1 * | 2/2020 | Lee | H01L 21/67288 |
| 2020/0166566 A1 * | 5/2020 | Sengupta | G01R 31/2856 |
| 2020/0191859 A1 * | 6/2020 | Yang | H01L 22/14 |
| 2020/0191861 A1 * | 6/2020 | Yang | H01L 22/30 |

* cited by examiner

PATTERN DESIGN FOR INTEGRATED CIRCUITS AND METHOD FOR INSPECTING THE PATTERN DESIGN FOR INTEGRATED CIRCUITS

CROSS-REFERENCE TO RELATED APPLICATION

A claims for priority under 35 U.S.C. § 119 is made to Korean Patent Application No. 10-2019-0045659, filed on Apr. 18, 2019 in the Korean Intellectual Property Office, the entire contents of which are hereby incorporated by reference.

BACKGROUND

The present inventive concepts relate to pattern design for integrated circuits and a method for inspecting the pattern design for integrated circuits.

Design rules, contact areas and critical dimensions, among other physical characteristics of semiconductor devices, have continuously been reduced as the degree of integration of integrated circuits fabricated using semiconductors has improved. Consequently, electronic circuits formed on substrates have become more complicated and circuit packing density of integrated circuits in substrates has gradually increased. The high circuit packing density of integrated circuits requires high operational precision during processing/fabrication of circuit units. Accordingly, there is a need for more sophisticated detection technology for detecting defects in electronic circuits.

SUMMARY

Embodiments of the inventive concepts are directed to providing a pattern design for integrated circuits and a method for inspecting the pattern design for integrated circuits.

Embodiments of the inventive concepts provide a pattern design including a first floating conductive line; a second floating conductive line; and a grounded conductive line disposed between the first floating conductive line and the second floating conductive line. The first floating conductive line, the second floating conductive line, and the grounded conductive line are divided into a main pad region, a plurality of subregions, a plurality of sub-pad regions, and a ground region. The main pad region is positioned at a first end portion of the pattern design. The ground region is positioned at a second end portion of the pattern design. The plurality of subregions and the plurality of sub-pad regions are positioned between the main pad region and the ground region.

Embodiments of the inventive concepts further provide a pattern design including a first comb line; a second comb line; and a serpentine line disposed between the first comb line and the second comb line. The first comb line includes a first main line extending horizontally and a plurality of first branch lines extending perpendicularly from the first main line. The second comb line includes a second main line extending horizontally and a plurality of second branch lines extending perpendicularly from the second main line. The serpentine line extends between the plurality of first branch lines and the plurality of second branch lines in a serpentine shape. The first comb line includes a first main pad disposed at a first end portion of the first main line, and a plurality of first sub-pads respectively disposed at end portions of different single branch lines from among the plurality of first branch lines. The second comb line includes a second main pad disposed at a first end portion of the second main line, and a plurality of second sub-pads respectively disposed at end portions of different single branch lines from among the plurality of second branch lines. The serpentine line includes a third main pad disposed at a first end portion of the serpentine line and third sub-pads disposed between the plurality of first sub-pads and the plurality of second sub-pads.

Embodiments of the inventive concepts still further provide a defect inspection method of a pattern design for an electronic beam inspection apparatus including a controller. The defect inspection method includes scanning, by the controller, a main pad region formed at a first end portion of a pattern design using a particle beam and generating main pad information; scanning, by the controller, a first sub-pad region formed at a first end portion of a first subregion of the pattern design using the particle beam and generating first sub-pad information; and determining, by the controller, a state of the pattern design based on the main pad information and the first sub-pad information.

BRIEF DESCRIPTION OF THE DRAWINGS

The above and other objects and features of the inventive concepts will become apparent in view of the following detailed description made with reference to the accompanying.

DETAILED DESCRIPTION

Hereinafter, embodiments of the inventive concepts will be described in detail and clearly to such an extent that those of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
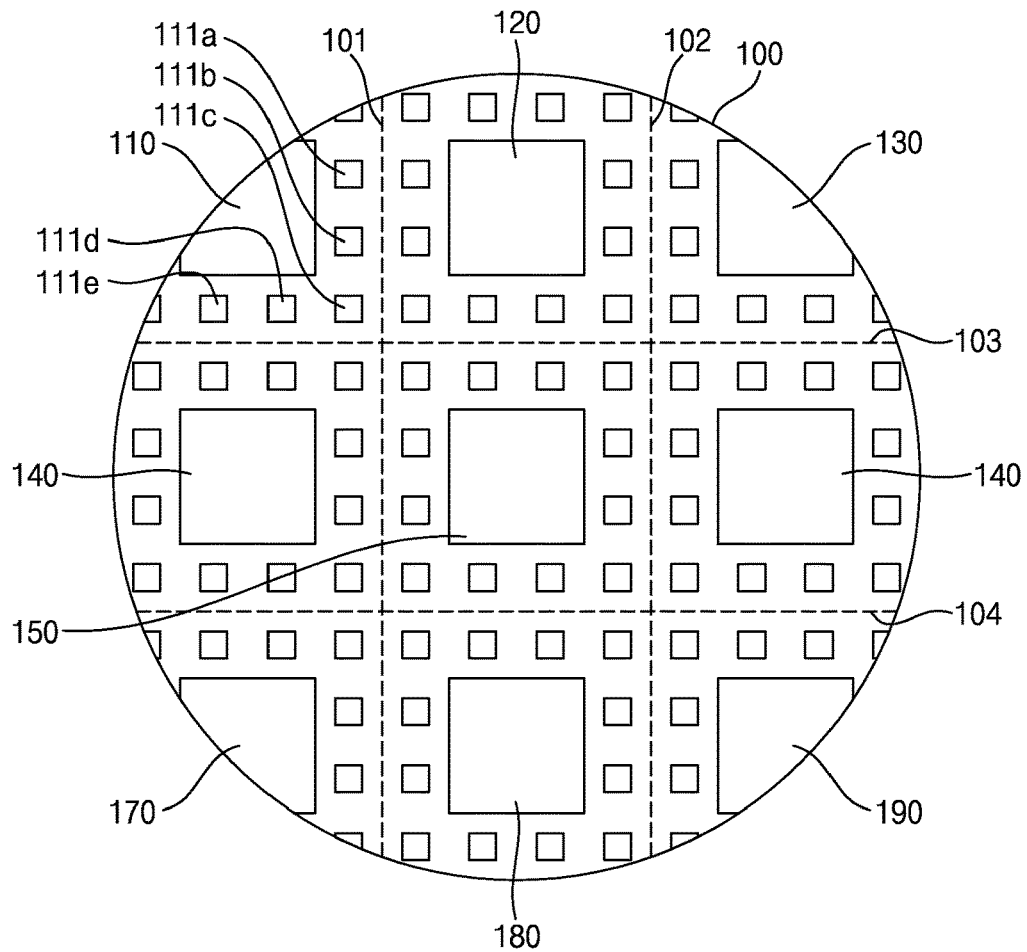
FIG. 1 illustrates a conceptual diagram showing pattern designs disposed along scribe lanes according to embodiments of the inventive concepts.

FIG. 1 illustrates a conceptual diagram showing pattern designs disposed along scribe lanes according to embodiments of the inventive concepts.

Referring to FIG. 1, semiconductor chips 110, 120, 130, 140, 150, 160, 170, 180 and 190 (i.e., semiconductor chips 110 to 190) on wafer 100 may be disposed to be spaced apart from each other with scribe lanes 101, 102, 103 and 104 (i.e., scribe lanes 101 to 104 indicated by dashed lines) as boundaries. Pattern designs for inspecting defects in the semiconductor chips 110 to 190 may be disposed in the scribe lanes 101 to 104. For example, the pattern designs 111a, 111b, 111c, 111d and 111e disposed around semiconductor chip 110, may be disposed on wafer 100 around semiconductor chips 110 to 190 adjacent to the scribe lanes, for electrical connection (not shown) with the corresponding semiconductor chips.

Figure 2:
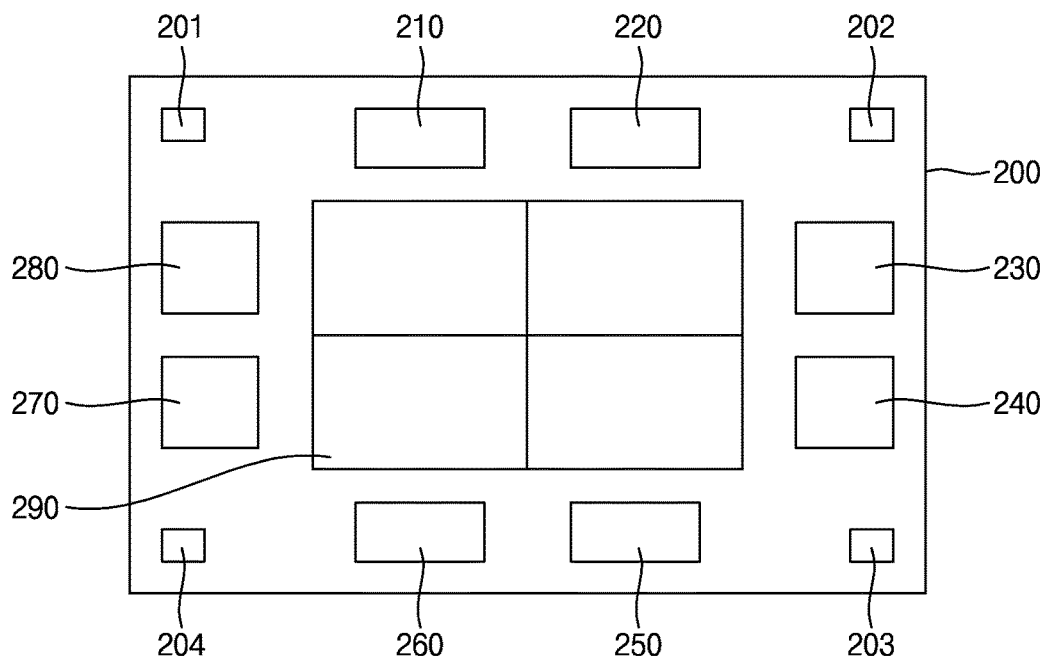
FIG. 2 illustrates a conceptual diagram showing pattern designs disposed inside a semiconductor chip according to embodiments of the inventive concepts.

FIG. 2 illustrates a conceptual diagram showing pattern designs disposed inside a semiconductor chip according to embodiments of the inventive concepts.

Referring to FIG. 2, various types of circuit patterns 210, 220, 230, 240, 250, 260, 270, 280 and 290 (i.e., circuit patterns 210 to 290) may be formed inside a semiconductor chip 200. Pattern designs 201, 202, 203 and 204 (i.e., pattern designs 201 to 204) for inspecting defects in the semiconductor chip 200 may be disposed in some regions of the semiconductor chip 200. For example, the pattern designs 201 to 204 may be disposed adjacent to edges of the semiconductor chip 200.

Figure 3:
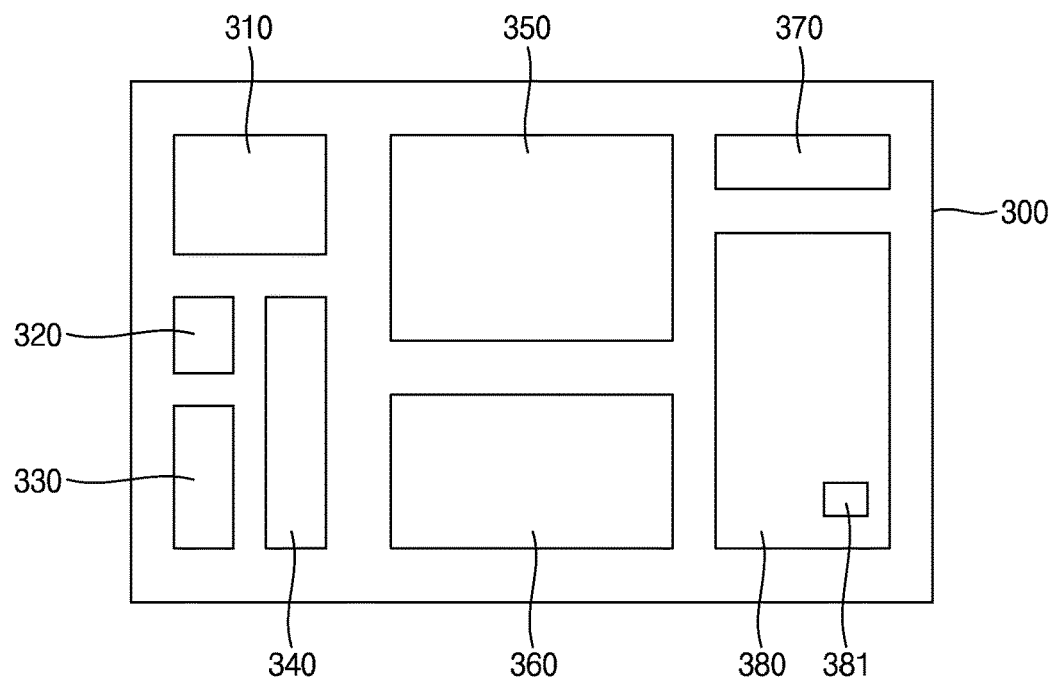
FIG. 3 illustrates a conceptual diagram showing a pattern design disposed in a test vehicle according to embodiments of the inventive concepts.

FIG. 3 illustrates a conceptual diagram showing a pattern design disposed in a test vehicle according to embodiments of the inventive concepts.

Referring to FIG. 3, a test vehicle 300 may include various types of test circuit pattern blocks 310, 320, 330, 340, 350, 360, 370 and 380 (i.e., test circuit pattern blocks 310 to 380). For example, the test circuit pattern blocks 310 to 380 may include various logic patterns for monitoring various processes. A pattern design 381 for inspecting defects in the test vehicle 300 may be disposed inside one of the test circuit pattern blocks 310 to 380. For example, pattern design 381 is shown in FIG. 3 as disposed inside test circuit pattern block 380, but in other embodiments pattern design 381 may be disposed inside any other of test circuit pattern blocks 310 to 370.

Figure 4:
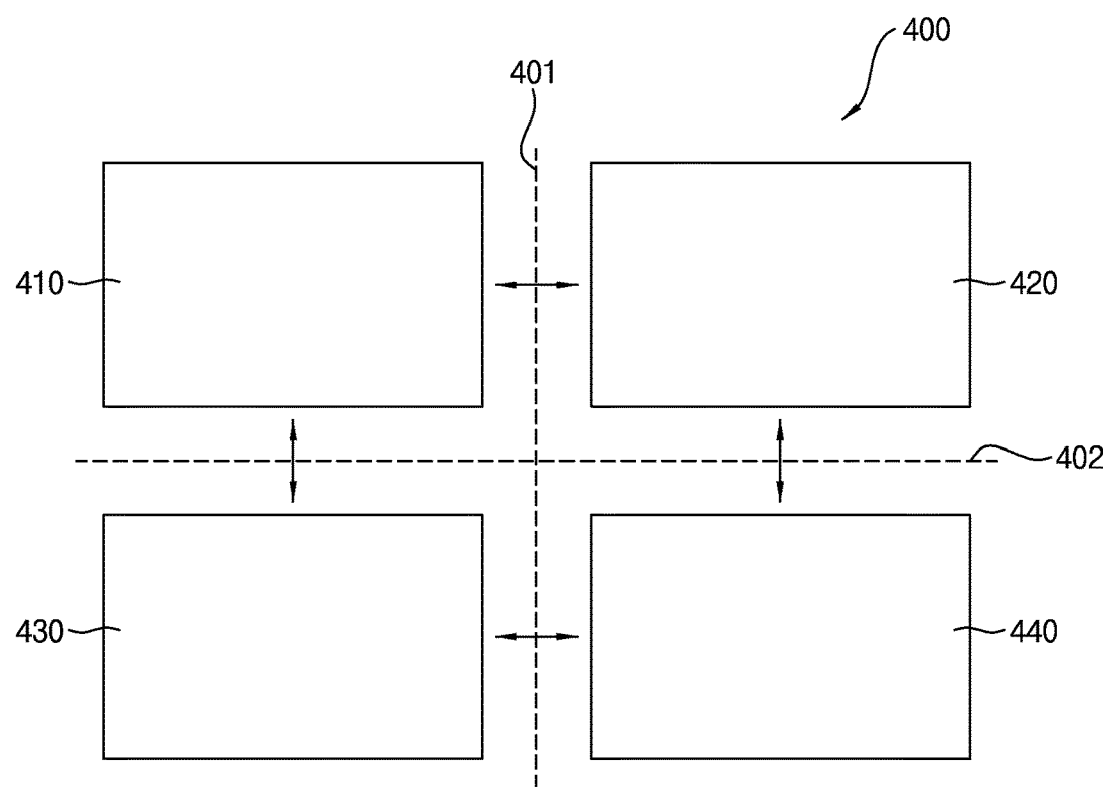
FIG. 4 illustrates a conceptual diagram showing a layout structure of a plurality of pattern designs according to embodiments of the inventive concepts.

FIG. 4 illustrates a conceptual diagram showing a layout structure of a plurality of pattern designs according to embodiments of the inventive concepts.

Referring to FIG. 4, a plurality of pattern designs 410, 420, 430 and 440 (i.e., 410 to 440) for inspecting defects may be disposed on one surface of one substrate 400. The plurality of pattern designs 410 to 440 may be disposed to mirror to each other with respect to reference lines 401 and 402.

For example, a first pattern design 410 and a second pattern design 420 may be horizontally reversed with reference to each other with respect to a first reference line 401. A third pattern design 430 and a fourth pattern design 440 may be horizontally reversed with reference to each other with respect to the first reference line 401.

The first pattern design 410 and the third pattern design 430 may be vertically inverted with reference to each other with respect to a second reference line 402. The second pattern design 420 and the fourth pattern design 440 may be vertically inverted with reference to each other with respect to the second reference line 402.

Figure 5:
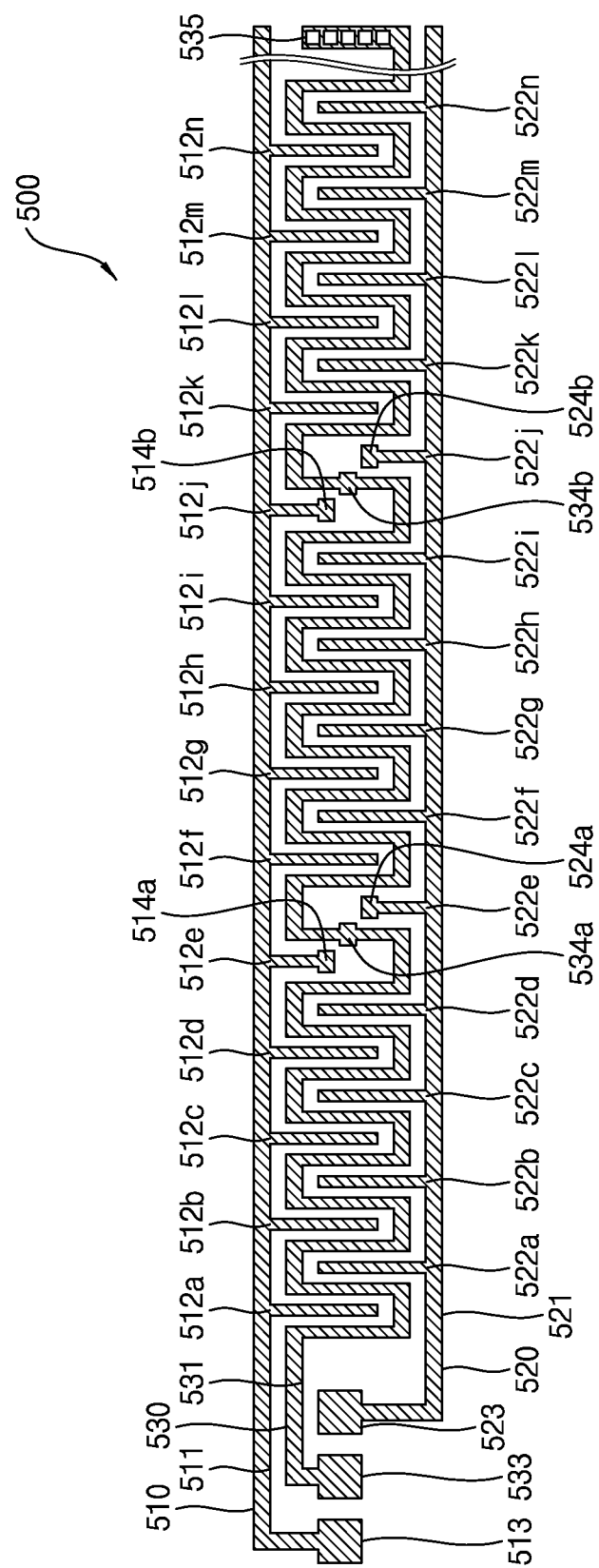
FIG. 5 illustrates a conceptual diagram showing a vertical pattern design according to embodiments of the inventive concepts.

FIG. 5 illustrates a conceptual diagram showing a vertical pattern design according to embodiments of the inventive concepts.

Referring to FIG. 5, a pattern design 500 may be a comb-serpentine pattern, which is a circuit pattern for testing. The pattern design 500 may include a first conductive line 510, a second conductive line 520, and a third conductive line 530 disposed between the first conductive line 510 and the second conductive line 520.

The first conductive line 510 may be referred to as a first comb line and may be characterized as having a first comb shape. The second conductive line 520 may be referred to as a second comb line and may be characterized as having a second comb shape. The third conductive line 530 may be referred to as a serpentine line.

The first conductive line 510 may include a first main line 511, a plurality of branch lines 512a, 512b, 512c, 512d, 512e, 512f, 512g, 512h, 512i, 512j, 512k, 512l, 512m and 512n (i.e., a plurality of branch lines 512a to 512n), a first main pad 513, and a plurality of sub-pads 514a and 514b. The first main line 511 may have a horizontally elongated shape. The plurality of branch lines 512a to 512n may have a shape extending perpendicularly from the first main line 511 toward the second conductive line 520. The first main pad 513 may be formed at a first end portion of the first conductive line 510. Each of the plurality of sub-pads 514a and 514b may be formed at a first end portion of at least one of the plurality of branch lines 512a to 512n. A second end portion of the first conductive line 510 may be floating.

Each of $1^{st}$-1 to $1^{st}$-4 branch lines 512a to 512d may be longer than the $1^{st}$-5 branch line 512e. A first end portion of the $1^{st}$-5 branch line 512e may be connected to a $1^{st}$-1 sub-pad 514a. The $1^{st}$-1 sub-pad 514a may be formed at the first end portion of the $1^{st}$-5 branch line 512e.

Each of $1^{st}$-6 to $1^{st}$-9 branch lines 512f to 512i may be longer than a $1^{st}$-10 branch line 512j. A first end portion of the $1^{st}$-10 branch line 512j may be connected to the $1^{st}$-2 sub-pad 514b. The $1^{st}$-2 sub-pad 514b may be formed at the first end portion of the $1^{st}$-10 branch line 512j.

Each of $1^{st}$-11 to $1^{st}$-14 branch lines 512k to 512n may be longer than the $1^{st}$-10 branch line 512j.

The second conductive line 520 may include a second main line 521, a plurality of branch lines 522a, 522b, 522c, 522d, 522e, 522f, 522g, 522h, 522i, 522j, 522k, 522l, 522m and 522n (i.e., a plurality of branch lines 522a to 522n), a second main pad 523, and a plurality of sub-pads 524a and 524b.

The second main line 521 may have a horizontally elongated shape. The second main line 521 may be parallel to the first main line 511. The plurality of branch lines 522a to 522n may have a shape extending perpendicularly from one side of the second main line 521 toward the first conductive line 510. The second main pad 523 may be formed at a first end portion of the second conductive line 520. Each of the plurality of sub-pads 524a and 524b may be formed at a first end portion of at least one of the plurality of branch lines 522a to 522n. A second end portion of the second conductive line 520 may be floating.

The plurality of branch lines 522a to 522n of the second conductive line 520 may be interdigitated to be coplanar with the plurality of branch lines 512a to 512n of the first conductive line 510. For example, a $2^{nd}$-1 branch line 522a may be disposed between the $1^{st}$-1 branch line 512a and the $1^{st}$-2 branch line 512b. A $2^{nd}$-2 branch line 522b may be disposed between the $1^{st}$-2 branch line 512b and a $1^{st}$-3 branch line 512c. A $2^{nd}$-3 branch line 522c may be disposed between the $1^{st}$-3 branch line 512c and the $1^{st}$-4 branch line 512d. A $2^{nd}$-4 branch line 522d may be disposed between the $1^{st}$-4 branch line 512d and the $1^{st}$-5 branch line 512e. A $2^{nd}$-5 branch line 522e may be disposed between the $1^{st}$-5 branch line 512e and the $1^{st}$-6 branch line 512f. A first end portion of the $2^{nd}$-5 branch line 522e may be connected to a $2^{nd}$-1 sub-pad 524a. The $2^{nd}$-1 sub-pad 524a may be formed at the first end portion of the $2^{nd}$-5 branch line 522e. Each of the $2^{nd}$-1 to $2^{nd}$-4 branch lines 522a to 522d may be longer than the $2^{nd}$-5 branch line 522e.

A $2^{nd}$-6 branch line 522f may be disposed between the $1^{st}$-6 branch line 512f and the $1^{st}$-7 branch line 512g. A $2^{nd}$-7 branch line 522g may be disposed between the $1^{st}$-7 branch line 512g and the $1^{st}$-8 branch line 512h. A $2^{nd}$-8 branch line 522h may be disposed between the $1^{st}$-8 branch line 512h and the $1^{st}$-9 branch line 512i. A $2^{nd}$-9 branch line 522i may be disposed between the $1^{st}$-9 branch line 512i and the $1^{st}$-10 branch line 512j. A $2^{nd}$-10 branch line 522j may be disposed between the $1^{st}$-10 branch line 512j and a $1^{st}$-11 branch line 512k. A first end portion of the $2^{nd}$-10 branch line 522j may be connected to a $2^{nd}$-2 sub-pad 524b. The $2^{nd}$-2 sub-pad 524b may be formed at the first end portion of the $2^{nd}$-10 branch line 522j. Each of the $2^{nd}$-6 to $2^{nd}$-9 branch lines 522f to 522i may be longer than the $2^{nd}$-10 branch line 522j.

A $2^{nd}$-11 branch line 522k may be disposed between the $1^{st}$-11 branch line 512k and a $1^{st}$-12 branch line 512l. A $2^{nd}$-12 branch line 522l may be disposed between the $1^{st}$-12 branch line 512l and a $1^{st}$-13 branch line 512m. A $2^{nd}$-13 branch line 522m may be disposed between the $1^{st}$-13 branch line 512m and a $1^{st}$-14 branch line 512n. A $2^{nd}$-14 branch line 522n may be disposed adjacent to one side surface of the $1^{st}$-14 branch line 512n. Each of $2^{nd}$-11 to $2^{nd}$-14 branch lines 522k to 522n may be longer than the $2^{nd}$-10 branch line 522j.

The third conductive line 530 may include a third main line 531, a third main pad 533, a plurality of sub-pads 534a and 534b, and a ground 535. The third main pad 533 may be formed at a first end portion of the third conductive line 530. The third conductive line 530 may have a snaked shape extending in a serpentine manner along a separation space between the plurality of branch lines 512a to 512n of the first conductive line 510 and the plurality of branch lines 522a to 522n of the second conductive line 520. For example, the third conductive line 530 may have a shape extending to be curved along the separation space between the plurality of branch lines 512a to 512n of the first conductive line 510 and the plurality of branch lines 522a to 522n of the second conductive line 520.

The third conductive line 530 may be disposed to be spaced apart from the plurality of branch lines 512a to 512n of the first conductive line 510 and the plurality of branch lines 522a to 522n of the second conductive line 520. A $3^{rd}$-1 sub-pad 534a may be formed on the third conductive line 530 so as to be adjacent to the $1^{st}$-1 sub-pad 514a and the $2^{nd}$-1 sub-pad 524a. A $3^{rd}$-2 sub-pad 534b may be formed on the third conductive line 530 so as to be adjacent to the $1^{st}$-2 sub-pad 514b and the $2^{nd}$-2 sub-pad 524b. The ground 535 may be formed at a second end portion of the third conductive line 530.

The pattern design 500 may be divided into a main pad region, first to third subregions, first and second sub-pad regions, and a ground region. For example, the main pad region may refer to a region in which the first to third main pads 513, 523, and 533 of the pattern design 500 are formed. The main pad region may be characterized as positioned at a first end portion of pattern design 500, and the ground region may be characterized as positioned at a second end portion of pattern design 500, wherein the first end portion and the second end portion are at opposite ends of pattern design 500.

The first sub-pad region may refer to a region in which the $1^{st}$-1, $2^{nd}$-1, and $3^{rd}$-1 sub-pads 514a, 524a, and 534a of the pattern design 500 are formed. The first subregion may refer to a region from the main pad region to the first sub-pad region of the pattern design 500.

The second sub-pad region may refer to a region in which the $1^{st}$-2, $2^{nd}$-2 and $3^{rd}$-2 sub-pads 514b, 524b, and 534b of the pattern design 500 are formed. The second subregion may refer to a region from the first sub-pad region to the second sub-pad region of the pattern design 500.

The third subregion may refer to a region from the second sub-pad region of the pattern design 500 to a second end portion of the pattern design 500.

Figure 6:
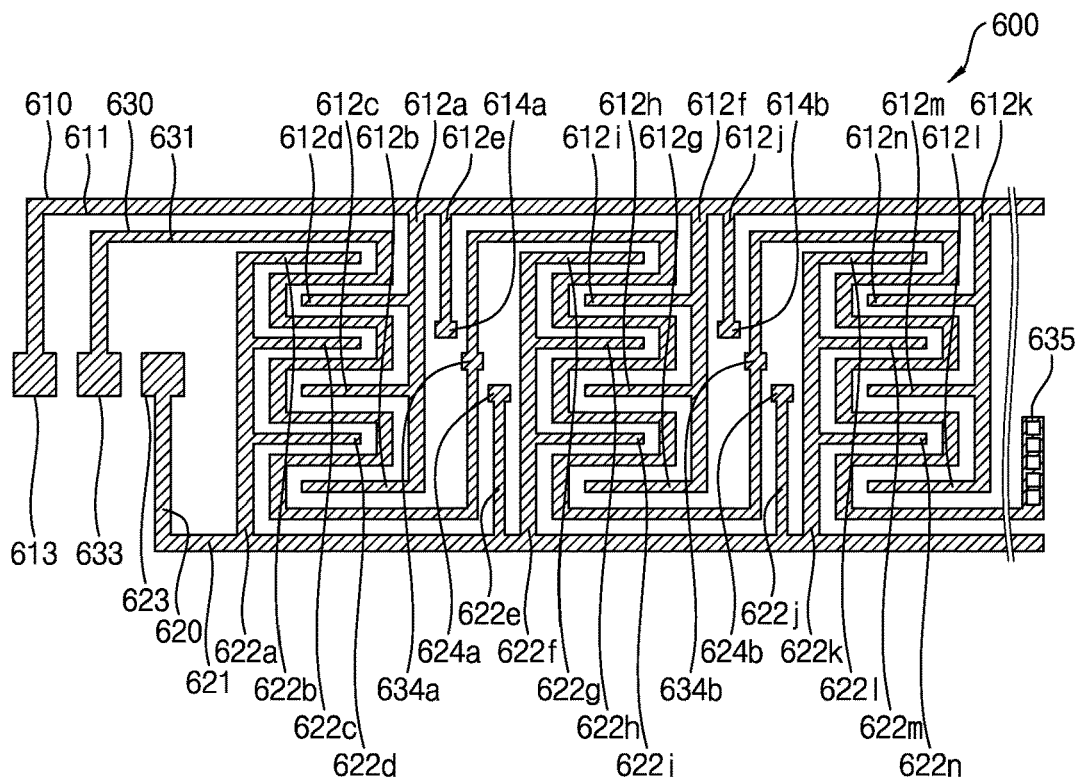
FIG. 6 illustrates a conceptual diagram showing a horizontal pattern design according to embodiments of the inventive concepts.

FIG. 6 illustrates a conceptual diagram showing a horizontal pattern design according to example embodiments of the inventive concepts.

Referring to FIG. 6, a horizontal pattern design 600 may include a plurality of conductive lines 610, 620, and 630 similar to the conductive lines of the vertical pattern design 500.

The horizontal pattern design 600 may be somewhat similar to the vertical pattern design 500. For example, main pads 613, 623, and 633 of the pattern design 600 may be identical or similar to the main pads 513, 523, and 533 of the pattern design 500 of FIG. 5. $1^{st}$-1, $2^{nd}$-1, and $3^{rd}$-1 sub-pads 614a, 624a, and 634a of the pattern design 600 may be identical or similar to the $1^{st}$-1, $2^{nd}$-1, and $3^{rd}$-1 sub-pads 514a, 524a, and 534a of the pattern design 500 of FIG. 5. A first end portion of the branch line 612e may be connected to a $1^{st}$-1 sub-pad 614a, and a first end portion of the branch line 622e may be connected to a $2^{nd}$-1 sub-pad 624a. Also, a first end portion of the branch line 612j may be connected to a $1^{st}$-2 sub-pad 614b, and a first end portion of the branch line 622j may be connected to a $2^{nd}$-2 sub-pad 624b.

A structure of the plurality of conductive lines 610, 620, and 630 of the horizontal pattern design 600 may be somewhat different from the structure of the plurality of conductive lines 510, 520, and 530 of the vertical pattern design 500. For example, first to third subregions of the horizontal pattern design 600 may be different from the first to third subregions of the vertical pattern design 500 of FIG. 5. The first subregion of the horizontal pattern design 600 may have a structure as follows.

A $1^{st}$-2 branch line 612b of a first conductive line 610 may have a shape extending in a direction from a first end portion of a $1^{st}$-1 branch line 612a to one side of the $1^{st}$-1 branch line 612a.

A $1^{st}$-3 branch line 612c may have a shape extending in a direction from one point of the $1^{st}$-1 branch line 612a to one side of the $1^{st}$-1 branch line 612a. The $1^{st}$-3 branch line 612c may be disposed between the $1^{st}$-2 branch line 612b and a first main line 611 of first conductive line 610. The $1^{st}$-3 branch line 612c may be disposed to be spaced apart from the $1^{st}$-2 branch line 612b and the first main line 611.

A $1^{st}$-4 branch line 612d may have a shape extending in a direction from another point of the $1^{st}$-1 branch line 612a to one side of the $1^{st}$-1 branch line 612a. The $1^{st}$-4 branch line 612d may be disposed between the $1^{st}$-3 branch line 612c and the first main line 611. The $1^{st}$-4 branch line 612d may be disposed to be spaced apart from the $1^{st}$-3 branch line 612c and the first main line 611.

A $2^{nd}$-1 branch line 622a of a second conductive line 620 may be disposed between a second main pad 623 and the $1^{st}$-1 branch line 612a. The $2^{nd}$-1 branch line 622a may be disposed to be spaced apart from the second main pad 623 and the $1^{st}$-1 branch line 612a.

A $2^{nd}$-2 branch line 622b may have a shape extending in a direction from a first end portion of the $2^{nd}$-1 branch line 622a to one side of the $2^{nd}$-1 branch line 622a. The $2^{nd}$-2 branch line 622b may be disposed between the first main line 611 and the $1^{st}$-4 branch line 612d. The $2^{nd}$-2 branch line 622b may be disposed to be spaced apart from the first main line 611 and the $1^{st}$-4 branch line 612d.

A $2^{nd}$-3 branch line 622c may have a shape extending in a direction from one point of the $2^{nd}$-1 branch line 622a to one side of the $2^{nd}$-1 branch line 622a. The $2^{nd}$-3 branch line 622c may be disposed between a second main line 621 of second conductive line 620 and the $2^{nd}$-2 branch line 622b. The $2^{nd}$-3 branch line 622c may be disposed to be spaced apart from the second main line 621 and the $2^{nd}$-2 branch line 622b. The $2^{nd}$-3 branch line 622c may be disposed between the $1^{st}$-3 branch line 612c and the $1^{st}$-4 branch line 612d. The $2^{nd}$-3 branch line 622c may be disposed to be spaced apart from the $1^{st}$-3 branch line 612c and the $1^{st}$-4 branch line 612d.

A $2^{nd}$-4 branch line 622d may have a shape extending in a direction from another point of the $2^{nd}$-1 branch line 622a to one side of the $2^{nd}$-1 branch line 622a. The $2^{nd}$-4 branch line 622d may be disposed between the second main line 621 and the $2^{nd}$-3 branch line 622c. The $2^{nd}$-4 branch line 622d may be disposed to be spaced apart from the second main line 621 and the $2^{nd}$-3 branch line 622c. The $2^{nd}$-4 branch line 622d may be disposed between the $1^{st}$-2 branch line 612b and the $1^{st}$-3 branch line 612c. The $2^{nd}$-4 branch line 622d may be disposed to be spaced apart from the $1^{st}$-2 branch line 612b and the $1^{st}$-3 branch line 612c.

The second subregion of the horizontal pattern design 600 may have an identical or similar structure to the first subregion. For example, a structure of $1^{st}$-6 to $1^{st}$-9 branch lines 612f to 612i of the second subregion may be identical or similar to the structure of the $1^{st}$-1 to $1^{st}$-4 branch lines 612a to 612d of the first subregion. A structure of $2^{nd}$-6 to $2^{nd}$-9 branch lines 622f to 622i of the second subregion may be identical or similar to the structure of the $2^{nd}$-1 to $2^{nd}$-4 branch lines 622a to 622d of the first subregion.

The third subregion of the horizontal pattern design 600 may have an identical or similar structure to the second subregion. For example, a structure of $1^{st}$-11 to $1^{st}$-14 branch lines 612k to 612n of the third subregion may be identical or similar to the structure of the $1^{st}$-6 to $1^{st}$-9 branch lines 612f to 612i of the second subregion. A structure of $2^{nd}$-11 to $2^{nd}$-14 branch lines 622k to 622n of the third subregion may be identical or similar to the structure of the $2^{nd}$-6 to $2^{nd}$-9 branch lines 622f to 622i of the second subregion.

A third conductive line 630 may include a third main line 631 that may have a snaked shape extending in a serpentine manner along a separation space between the first main line 611, the second main line 621, and the plurality of branch lines 612a to 612n and 622a to 622n. The $3^{rd}$-1 sub-pad 634a and the $3^{rd}$-2 sub-pad 634b are disposed on third main line 631. Also, the ground 535 may be formed at a second end portion of the third conductive line 630.

Figure 7A:
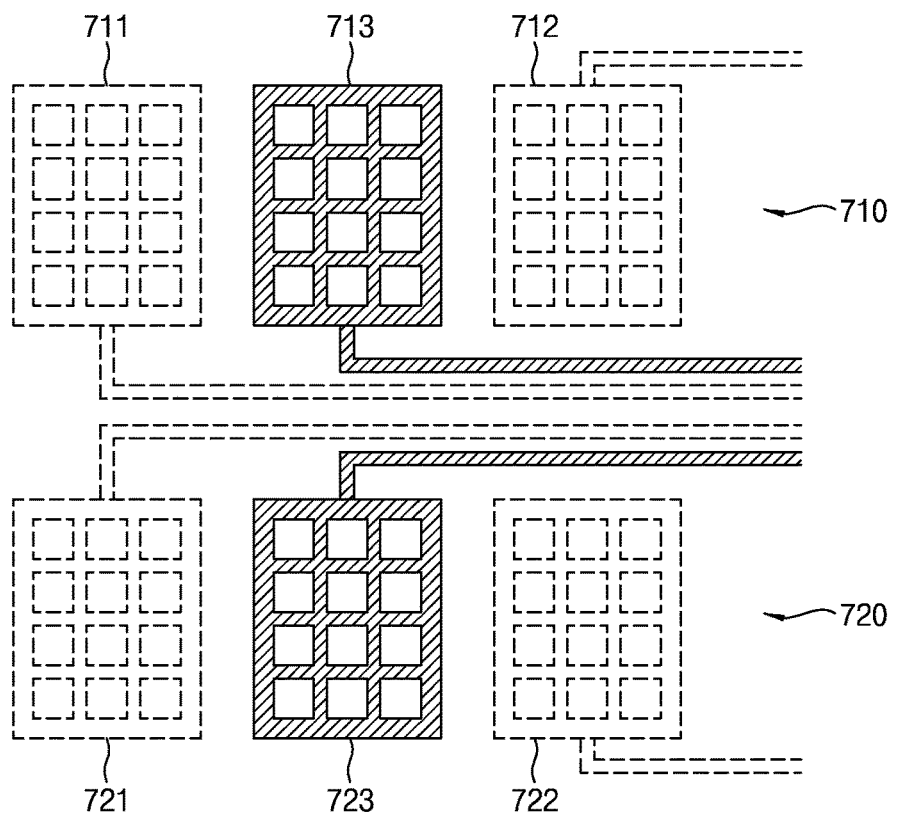
FIG. 7A illustrates a conceptual diagram showing voltage contrast images of a main pad of a pattern design when pattern designs are in a normal state, according to embodiments of the inventive concepts.
Figure 7B:
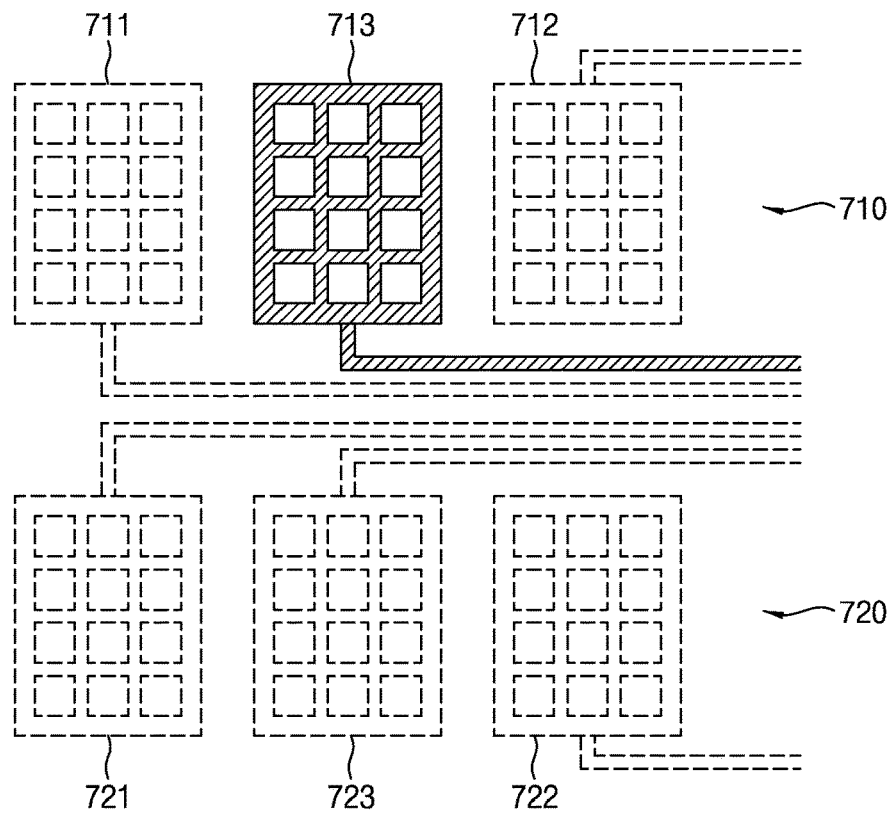
FIG. 7B illustrate a conceptual diagram showing voltage contrast images when a defect occurs in a third conductive line of a second pattern design, according to embodiments of the inventive concepts.
Figure 7C:
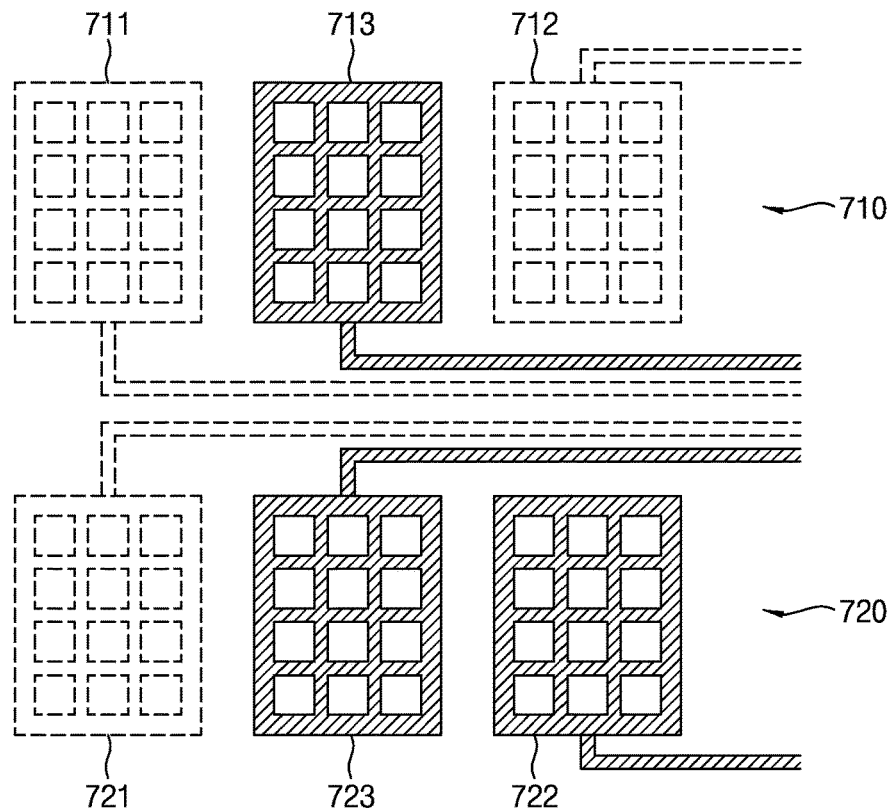
FIG. 7C illustrates a conceptual diagram showing voltage contrast images when a defect occurs in a second conductive line of a second pattern design, according to embodiments of the inventive concepts.

FIGS. 7A to 7C illustrate conceptual diagrams showing voltage contrast images of a main pad of a pattern design according to embodiments of the inventive concepts according to a state.

Voltage contrast inspection (VCI) technology is inspection technology for detecting defects included in electronic circuits. For example, in the VCI technology, inspection may be performed on a pattern design implemented in a test chip using charged particles such as an electron beam or an ion beam for example. In the VCI technology, it is possible to obtain a voltage contrast image for a pattern design. In the VCI technology, it is possible to inspect defects in the pattern design by comparing a voltage contrast image in a normal state with the obtained voltage contrast image of the pattern design. For example, defect inspection may be performed on the pattern design using a defect inspection apparatus to which the VCI technology is applied. The defect inspection apparatus may be referred to as an electron beam inspection apparatus.

For example, the electron beam inspection apparatus may scan a pattern design using an electron beam. The electron beam inspection apparatus may classify a portion of a pattern design in which a voltage contrast image that appears is different from a reference voltage contrast image of the portion of the pattern design as a defect on the voltage contrast image according to a scan result. The electron beam inspection apparatus may determine a position and type of the defect of the pattern design using the defect on the voltage contrast image.

For example, the electron beam inspection apparatus may include a scanner, a display, a user interface, a memory, and a controller.

For example, the scanner may scan a main pad region formed in a first end portion of the pattern design using a particle beam. The controller may determine main pad information on the basis of a scan result for the main pad region. The scanner may scan a first sub-pad region formed in a first end portion of a first subregion of the pattern design using the particle beam. The controller may generate first sub-pad information on the basis of a scan result for the first sub-pad region.

The main pad information may indicate whether there is a defect in an entirety of the pattern design. The first sub-pad information may indicate whether there is a defect in the first subregion positioned between the first end portion and the second end portion of the pattern design.

The main pad information may indicate that the pattern design is in a normal state when a main voltage contrast image detected from the main pad region using the particle beam is the same as the reference voltage contrast image.

The main pad information may indicate that the pattern design is in a defective state when the main voltage contrast image detected from the main pad region using the particle beam is different from the reference voltage contrast image.

The first sub-pad information may indicate that the first subregion is in a normal state when the main voltage contrast image detected from the main pad region using the particle beam is the same as a first sub voltage contrast image detected from the first sub-pad region using the particle beam. As will be understood from the description hereinafter, The first sub-pad information may indicate that the first subregion is in a defective state when the main voltage contrast image detected from the main pad region using the particle beam is different from the first sub voltage contrast image detected from the first sub-pad region using the particle beam.

The display may display scan results. The user interface may include an interface for a user of the electron beam inspection apparatus. The memory may store various types of commands and programs which are used in the electron beam inspection apparatus. The controller may perform an overall control operation on the electron beam inspection apparatus.

FIG. 7A illustrates a conceptual diagram showing voltage contrast images when pattern designs are in a normal state.

Referring to FIG. 7A, the electron beam inspection apparatus may scan main pads of the pattern designs and display voltage contrast images 710 and 720. The main pads may be identical or similar to the main pads 513, 523, and 533 of FIG. 5 or the main pads 613, 623, and 633 of FIG. 6. For example, the first, second and third main pad images 711, 712 and 713 of the voltage contrast image 710 may correspond respectively to images of main pads 513, 523, and 533 of FIG. 5 or the main pads 613, 623, and 633 of FIG. 6. For example, the first, second and third main pad images 721, 722 and 723 of the second contrast image 720 may correspond respectively to images of main pads 513, 523, and 533 of FIG. 5 or the main pads 613, 623, and 633 of FIG. 6. Each of the main pads may have a structure in the form of a lattice or a matrix, and may be characterized as having a conductive line of a lattice-type pattern.

The electron beam inspection apparatus may determine whether there is a defect in the pattern designs using the contrast of the voltage contrast images 710 and 720 of the pattern design. For example, when a first pattern design is in a normal state, a first main pad image 711 and a second main pad image 712 of the voltage contrast image 710 of the first pattern design may be displayed as dark images (as indicated by dashed lines). When the first pattern design is in a normal state, a third main pad image 713 may be displayed as a bright image (as indicated with cross-hatched lines).

When a second pattern design is in a normal state, the voltage contrast image 720 of the second pattern design may be the same as the voltage contrast image 710 of the first pattern design. For example, when the second pattern design is in a normal state, a first main pad image 721 and a second main pad image 722 of the second pattern design may be displayed as dark images in the same manner as the first main pad image 711 and the second main pad image 712 of the first pattern design. When the second pattern design is in a normal state, a third main pad image 723 of the second pattern design may be displayed as a bright image in the same manner as the third main pad image 713 of the first pattern design.

FIG. 7B illustrates a conceptual diagram showing voltage contrast images when a defect occurs in a third conductive line of the second pattern design.

Referring to FIG. 7B, when the second pattern design is in a defective state, the voltage contrast image 720 of the second pattern design may be different from the voltage contrast image 710 of the first pattern design. For example, when the third conductive line of the second pattern design is opened, the third main pad image 723 may be displayed as a dark image differently from the third main pad image 713 of the first pattern design.

FIG. 7C is a conceptual diagram showing voltage contrast images when a defect occurs in a second conductive line of the second pattern design.

Referring to FIG. 7C, when the second conductive line of the second pattern design is short-circuited, the second main pad image 722 may be displayed as a bright image differently from the second main pad image 712 of the first pattern design.

The electron beam inspection apparatus may inspect first sub-pads of the second pattern design when it is determined that there is a defect in the second pattern design. Voltage contrast images of the first sub-pads may be displayed as shown in FIGS. 8A to 8C below.

Figure 8A:
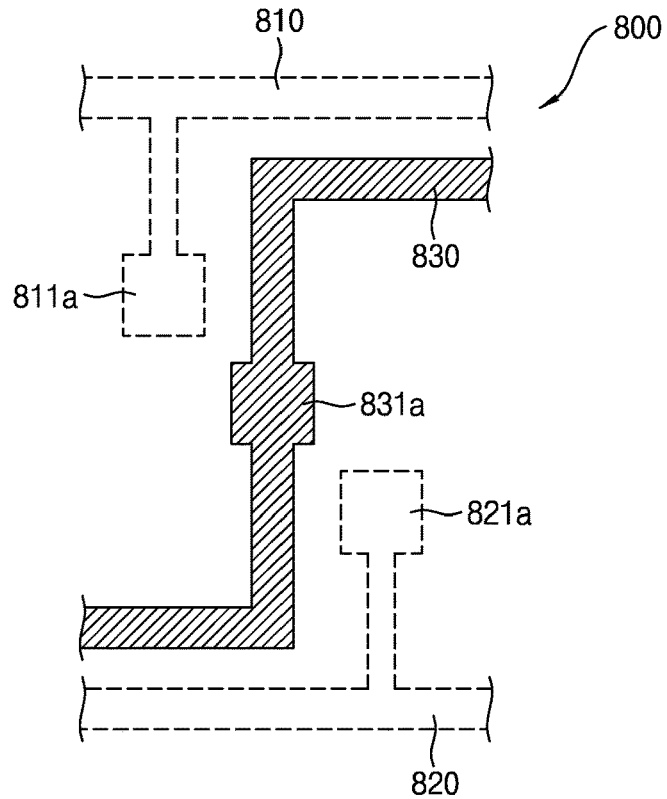
FIG. 8A illustrates a conceptual diagram showing voltage contrast images of first sub-pads when a first subregion is in a normal state, according to embodiments of the inventive concepts.
Figure 8B:
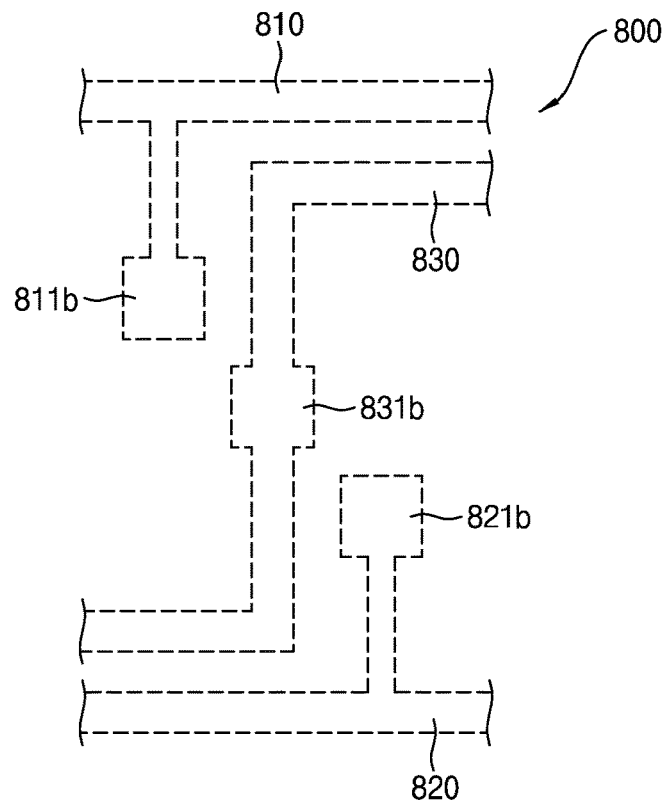
FIG. 8B illustrates a conceptual diagram showing voltage contrast images of second sub-pads when a third conductive line of a second subregion is in a defective state, according to embodiments of the inventive concepts.
Figure 8C:
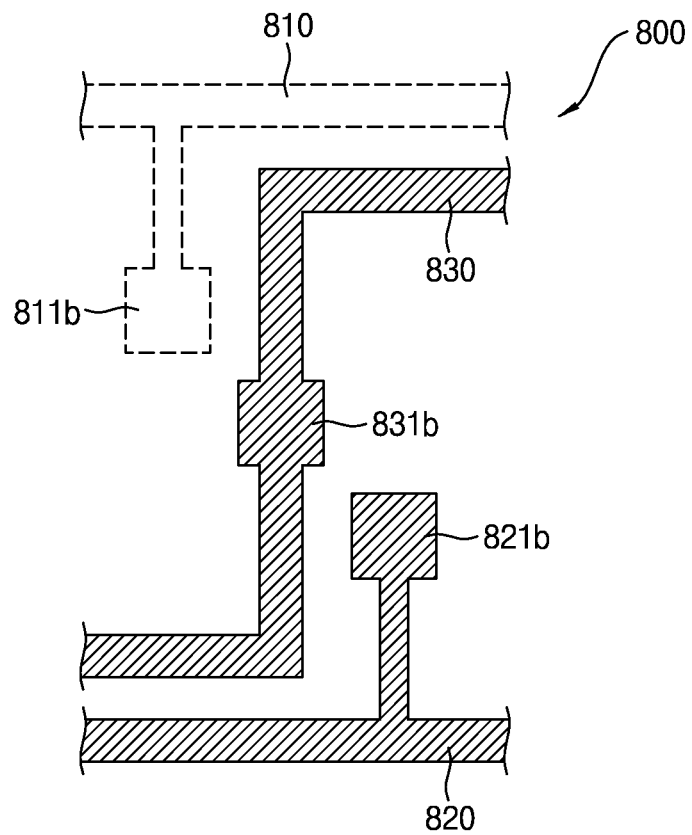
FIG. 8C illustrates a conceptual diagram showing voltage contrast images of second sub-pads when a second conductive line of a second subregion is in a defective state, according to embodiments of the inventive concepts.

FIGS. 8A to 8C illustrate conceptual diagrams showing voltage contrast images of sub-pads of a pattern design according to embodiments of the inventive concepts according to a state thereof.

FIG. 8A is a conceptual diagram showing voltage contrast images of first sub-pads when a first subregion is in a normal state (such as described with respect to FIG. 7A for example). The first subregion may be identical or similar to the first subregion of FIG. 5. The first subregion may be identical or similar to the first subregion of FIG. 6. The first sub-pads may be identical or similar to the $1^{st}$-1, $2^{nd}$-1, and $3^{rd}$-1 sub-pads 514a, 524a, and 534a of FIG. 5. The first sub-pads may be identical or similar to the $1^{st}$-1, $2^{nd}$-1, and $3^{rd}$-1 sub-pads 614a, 624a, and 634a of FIG. 6. The first, second and third conductive lines as described may respectively correspond to the first, second and third conductive lines 510, 520 and 530 of FIG. 5, or the first, second and third conductive lines 610, 620 and 630 of FIG. 6.

Referring to FIG. 8A, the electron beam inspection apparatus may scan first sub-pads of a second pattern design and display a voltage contrast image 800.

For example, when the first subregion is in a normal state, an image 810 of a first conductive line and a $1^{st}$-1 sub-pad image 811a may be dark images (as indicated by dashed lines). When the first subregion is in a normal state, an image 820 of a second conductive line and a $1^{st}$-2 sub-pad image 821a may be dark images (as indicated by dashed lines). When the first subregion is in a normal state, an image 830 of a third conductive line and a $1^{st}$-3 sub-pad image 831a may be bright images (as indicated with cross-hatched lines).

When it is determined that the first subregion is in a normal state, the electron beam inspection apparatus may inspect second sub-pads in order to determine whether there is a defect in a second subregion. For example, voltage contrast images of the second sub-pads may be displayed as shown in FIG. 8B or 8C below.

FIG. 8B illustrates a conceptual diagram showing voltage contrast images of second sub-pads when a third conductive line of the second subregion is in a defective state (such as described with respect to FIG. 7B for example). The second subregion may be identical or similar to the second subregion of FIG. 5. The second subregion may be identical or similar to the second subregion of FIG. 6. The second sub-pads may be identical or similar to the $1^{st}$-2, $2^{nd}$-2, and $3^{rd}$-2 sub-pads 514b, 524b, and 534b of FIG. 5. The second sub-pads may be identical or similar to $1^{st}$-2, $2^{nd}$-2, and $3^{rd}$-2 sub-pads 614b, 624b, and 634b of FIG. 6.

Referring to FIG. 8B, the electron beam inspection apparatus may scan the second sub-pads of the second pattern design and display a voltage contrast image 800.

For example, when the third conductive line of the second subregion is in a defective state, an image 830 of the third conductive line of the second subregion and a $2^{nd}$-3 sub-pad image 831b may be different from the image 830 of the third conductive line of the first subregion and the $1^{st}$-3 sub-pad image 831a of FIG. 8A. For example, the image 830 of the third conductive line of the second subregion and the $2^{nd}$-3 sub-pad image 831b may be dark images. In this case as described with respect to FIG. 8B, as the first and second conductive lines are assumed to not be in a defective state, an image 810 of a first conductive line and a $2^{nd}$-1 sub-pad image 811b may be dark images, and an image 820 of a second conductive line and a $2^{nd}$-2 sub-pad image 821b may be dark images.

FIG. 8C illustrates a conceptual diagram showing voltage contrast images of the second sub-pads when a second conductive line of the second subregion is in a defective state (such as described with respect to FIG. 7C for example). Referring to FIG. 8C, when the second conductive line of the second subregion is in a defective state, an image 820 of the second conductive line of the second subregion and a $2^{nd}$-2 sub-pad image 821b may be different from the image 820 of the second conductive line of the first subregion and the $1^{st}$-2 sub-pad image 821a of FIG. 8A. For example, the image 820 and the $2^{nd}$-2 sub-pad image 821b of the second conductive line of the second subregion may be bright images. In this case as described with respect to FIG. 8C, as the first and third conductive lines are assumed to not be in a defective state, an image 810 of a first conductive line and a $2^{nd}$-1 sub-pad image 811b may be dark images, and an image 830 of a third conductive line and a $2^{nd}$-3 sub-pad image 831b may be bright images.

The electron beam inspection apparatus may scan the second subregion using an electron beam when it is determined that the second subregion is in a defective state. For example, the voltage contrast images of the second subregion may be displayed as shown in FIGS. 9A to 9C below.

Figure 9A:
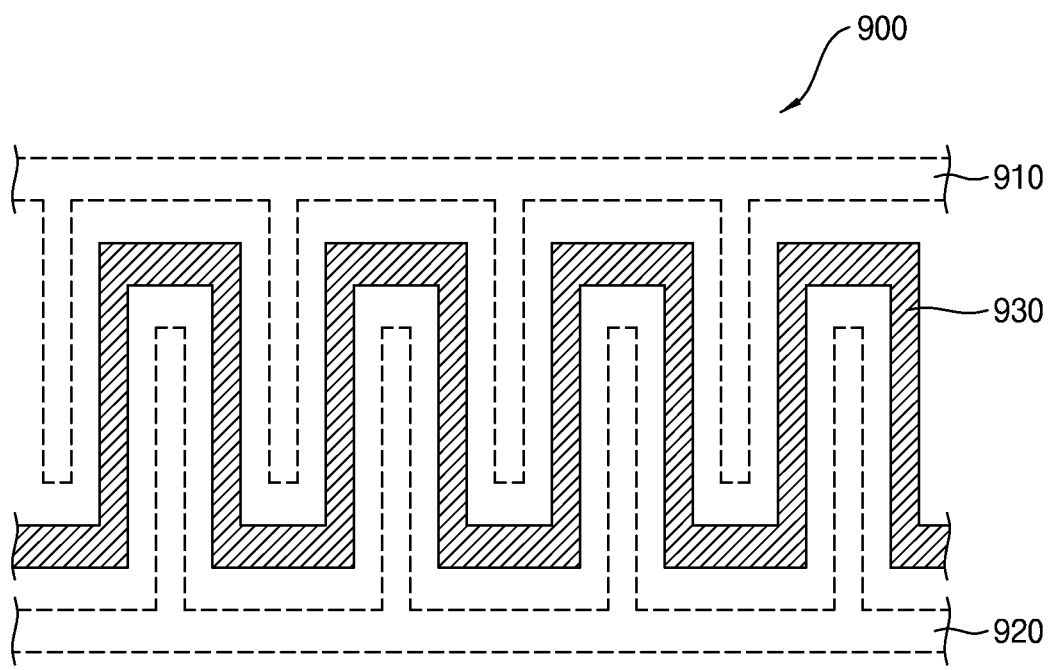
FIG. 9A illustrates a conceptual diagram showing voltage contrast images of a second subregion when the second subregion is in a normal state, according to embodiments of the inventive concepts.
Figure 9B:
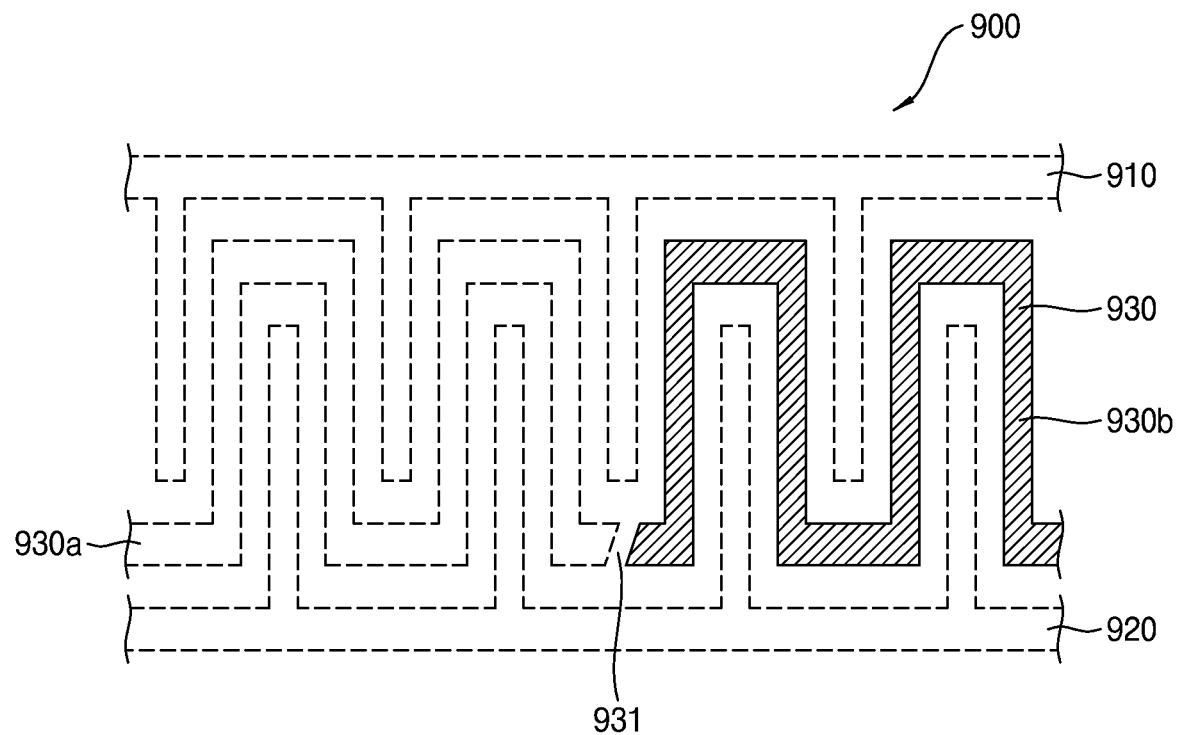
FIG. 9B illustrates a conceptual diagram showing voltage contrast images of a second subregion when a second conductive line of the second subregion is in a defective state, according to embodiments of the inventive concepts.
Figure 9C:
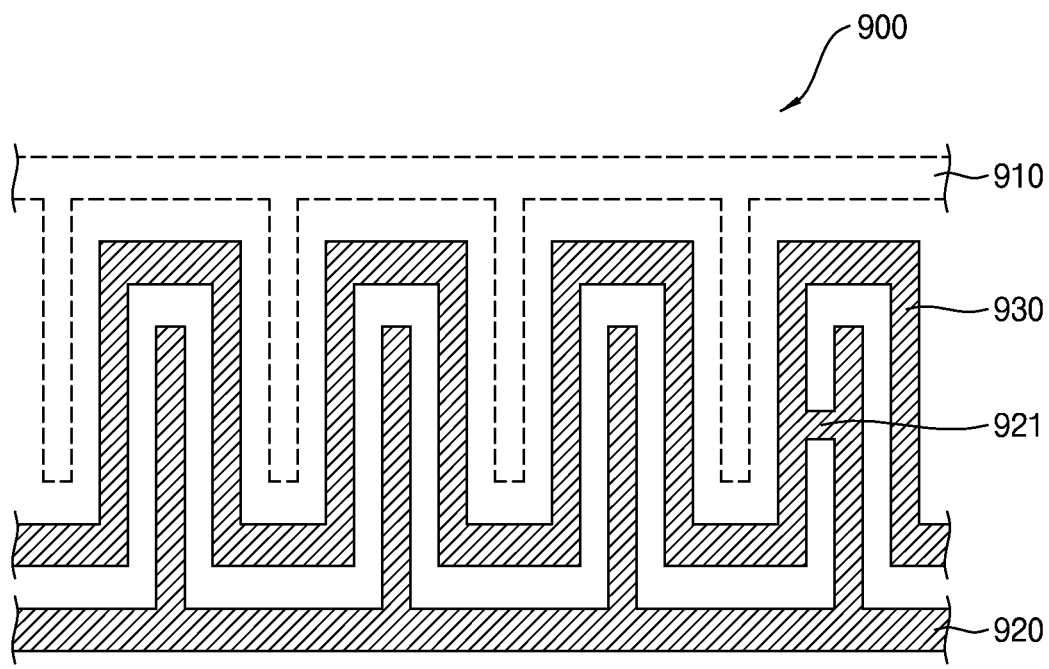
FIG. 9C illustrates a conceptual diagram showing voltage contrast images of a second subregion when a second conductive line and a third conductive line of the second subregion are short-circuited, according to embodiments of the inventive concepts.

FIGS. 9A to 9C illustrate conceptual diagrams showing voltage contrast images of conductive lines of a pattern design according to embodiments of the inventive concepts according to a state.

FIG. 9A illustrates a conceptual diagram showing voltage contrast images of a second subregion when the second subregion is in a normal state (such as described with respect to FIG. 7A for example). The second subregion may be identical or similar to the second subregion of FIG. 5. The second subregion may be identical or similar to the second subregion of FIG. 6.

Referring to FIG. 9A, the electron beam inspection apparatus may scan the second subregion and display a voltage contrast image 900.

For example, when the second subregion is in a normal state, an image 910 of a first conductive line and an image 920 of a second conductive line may be dark images (as indicated by dashed lines). When the second subregion is in a normal state, an image 930 of a third conductive line may be a bright image (as indicated with cross-hatched lines). The first, second and third conductive lines as described may respectively correspond to the first, second and third conductive lines 510, 520 and 530 of FIG. 5, or the first, second and third conductive lines 610, 620 and 630 of FIG. 6.

FIG. 9B illustrates a conceptual diagram showing voltage contrast images of the second subregion when the third conductive line of the second subregion is in a defective state. When the third conductive line of the second subregion is opened, an image 930a of a first region of the third conductive line is a dark image (not a bright image as it would be if in a normal state) because of an open portion 931. That is, when the third conductive line of the second subregion is opened because of open portion 931, an image 930a of the first region of the third conductive line is a dark image and an image 930b of a second region of the third conductive line is a bright image like an image in a normal state. The electron beam inspection apparatus may detect the open portion 931 of the third conductive line using the image 930a of the first region and the image 930b of the second region.

FIG. 9C illustrates a conceptual diagram showing voltage contrast images of the second subregion when the second conductive line and the third conductive line of the second subregion are short-circuited. When the second conductive line and the third conductive line of the second subregion are short-circuited, the image 920 of the second conductive line is a bright image (not a dark image as it would be if in a normal state). That is, when the second conductive line and the third conductive line of the second subregion are short-circuited because of short-circuited portion 921, an image of a short-circuited portion 921 is a dark image. The electron beam inspection apparatus may detect the short-circuited portion 921 using the image 920 of the second conductive line and the image 930 of the third conductive line.

Figure 10:
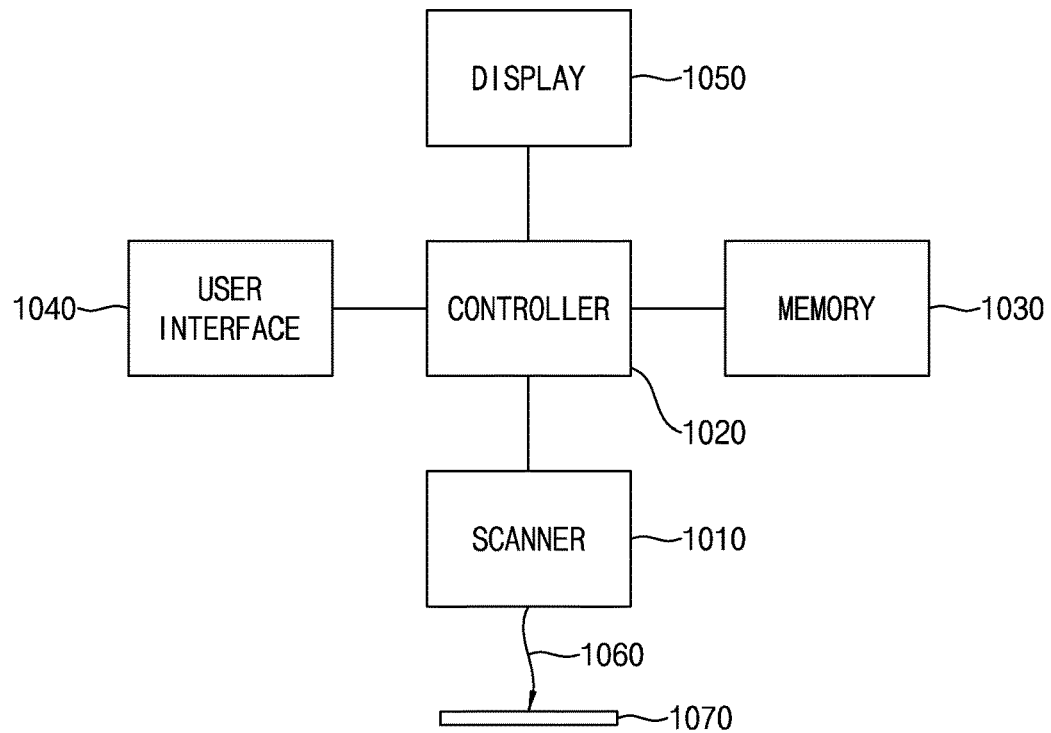
FIG. 10 illustrates an electron beam inspection apparatus according to embodiments of the inventive concepts.

FIG. 10 illustrates an electron beam inspection apparatus according to embodiments of the inventive concepts.

Referring to FIG. 10, electron beam inspection apparatus 10 may include scanner 1010, controller 1020, memory 1030, user interface 1040, and display 1050. Scanner 1010 may scan pattern design 1070 using particle beam 1060 under control of controller 1020. Controller 1020 may for example generate main pad information responsive to scanning a main pad region of pattern design 1070 which may be configured such as shown in FIG. 5, and may also for example generate first sub-pad information responsive to scanning a first sub-pad region of pattern design 1070 which may be configured as shown in FIG. 5. Controller 1020 may determine a state of the pattern design 1070 based on the main pad information and the first sub-pad information. Controller 1020 may be a device which includes one or more processor cores such as for example a general-purpose CPU, a dedicated application specific integrated circuit (ASIC), or an application processor.

Memory 1030 may store data used to operate electron beam inspection apparatus 10. For example, memory 1030 may include volatile/nonvolatile memory and may store processed data, results or data to be processed. The user interface 1040 may include for example at least one input device such as for example a keypad, a touch screen, or the like for the purpose of enabling user input into the electron beam inspection apparatus 10. Controller 1020 may for example display information related to the main pad information, the first sub-pad information and the state of the pattern design 1070 on display 1050. The electron beam inspection apparatus 10 may include additional circuits and components.

Figure 11:
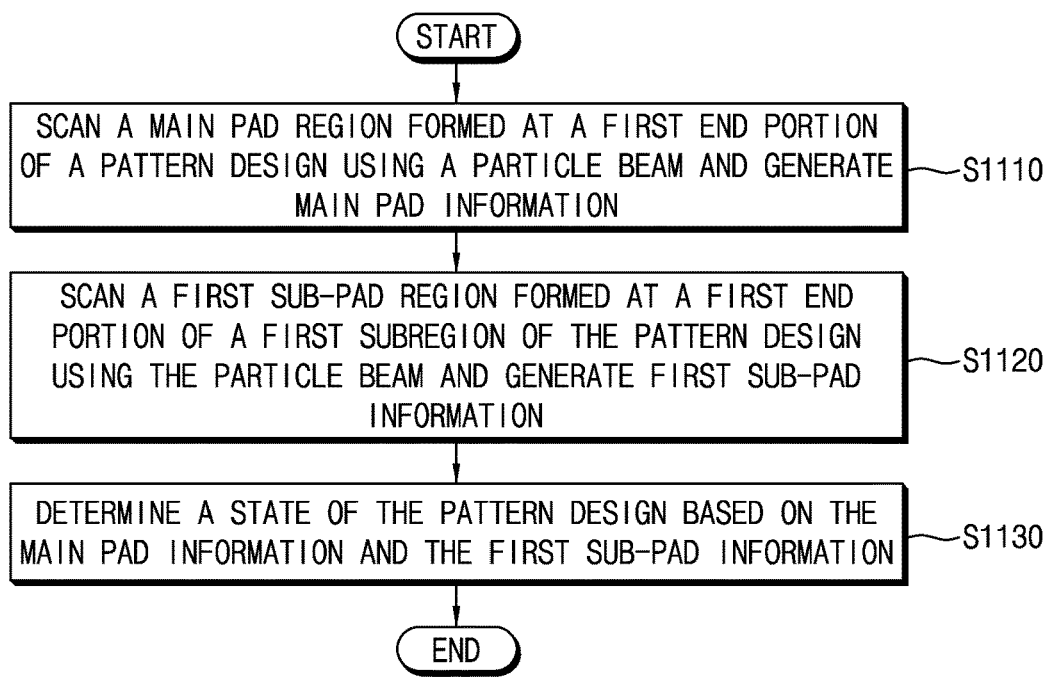
FIG. 11 illustrates a flow chart of a defect inspection method for pattern design according to embodiments of the inventive concepts.

FIG. 11 illustrates a flow chart of a defect inspection method for pattern design according to embodiments of the inventive concepts. The defect inspection method may for example be performed by electron beam inspection apparatus 10 as described with respect to FIG. 10 on a pattern design such as shown and described with respect to FIG. 5.

Referring to FIG. 11, in operation S1110, controller 1020 may control scanner 1010 to scan a main pad region formed at a first end portion of a pattern design such as pattern design 500 shown in FIG. 5 using particle beam 1060 and generate main pad information. In operation S1120, controller 1020 may control scanner 1010 to scan a first sub-pad region formed at a first end portion of a first subregion of the pattern design such as pattern design 500 shown in FIG. 5 using particle beam 1060 and generate first sub-pad information. In operation S1130, controller 1020 may determine a state of the pattern design such as pattern design 500 shown in FIG. 5 based on the main pad information and the first sub-pad information. As should be understood as previously described, electron beam inspection apparatus 10 may classify a portion of a pattern design in which a voltage contrast image that appears is different from a reference voltage contrast image of the portion of the pattern design as a defect on the voltage contrast image according to a scan result. The electron beam inspection apparatus may determine a position and type of the defect of the pattern design using the defect on the voltage contrast image.

According to the inventive concepts, by using the pattern design and the method for inspecting the pattern design, it is possible to significantly reduce time for inspecting defects in a circuit to which a pattern design is applied.

As will be appreciated by those skilled in the art, the inventive concepts may be modified and varied over a wide range of applications. Therefore, the scope of the inventive concepts should not be limited to any of the specific exemplary teachings discussed above but may be defined by the following claims.

What is claimed is:

1. A pattern design comprising:
a first floating conductive line;
a second floating conductive line; and
a grounded conductive line disposed between the first floating conductive line and the second floating conductive line,
wherein the first floating conductive line, the second floating conductive line, and the grounded conductive line are divided into a main pad region, a plurality of subregions, a plurality of sub-pad regions, and a ground region,
the main pad region is positioned at a first end portion of the pattern design,
the ground region is positioned at a second end portion of the pattern design,
the plurality of subregions and the plurality of sub-pad regions are positioned between the main pad region and the ground region,
the plurality of subregions comprise a first subregion and a second subregion,
the plurality of sub-pad regions comprises a first sub-pad region and a second sub-pad region, and
wherein the first sub-pad region comprises a first sub-pad, a second sub-pad, and a third sub-pad,
the first sub-pad is positioned at a first end portion of a branch line from among a plurality of first branch lines that extend from the first floating conductive line,
the second sub-pad is positioned at a first end portion of a branch line from among a plurality of second branch lines that extend from the second floating conductive line,
the third sub-pad is positioned at a portion of the grounded conductive line that passes between the first sub-pad and the second sub-pad,
the main pad region comprises a plurality of main pads,
a width of the first sub-pad is larger than widths of the plurality of first branch lines,
a width of the second sub-pad is larger than widths of the plurality of second branch lines, and
a width of the third sub-pad is larger than a width of the grounded conductive line.

2. The pattern design of claim 1, wherein the first floating conductive line has a first comb shape comprising a first main line and the plurality of first branch lines extending from the first main line toward the second floating conductive line,
the second floating conductive line has a second comb shape comprising a second main line and the plurality of second branch lines extending from the second main line toward the first floating conductive line, and
the plurality of first branch lines and the plurality of second branch lines are interdigitated to be coplanar with each other.

3. The pattern design of claim 2, wherein the grounded conductive line has a serpentine shape passing between the plurality of first branch lines and the plurality of second branch lines.

4. The pattern design of claim 1, wherein the plurality of main pads comprise:
a first main pad positioned at a first end portion of the first floating conductive line that corresponds to the first end portion of the pattern design;
a second main pad positioned at a first end portion of the second floating conductive line that corresponds to the first end portion of the pattern design; and
a third main pad positioned at a first end portion of the grounded conductive line that corresponds to the first end portion of the pattern design.

5. The pattern design of claim 4, wherein each of the first main pad, the second main pad and the third main pad comprise a conductive line of a lattice-type pattern.

6. The pattern design of claim 1, wherein the first subregion is positioned between the main pad region and the first sub-pad region, and the second subregion is positioned between the first sub-pad region and the second sub-pad region.

7. The pattern design of claim 1, wherein a first end portion of the first subregion is connected to the main pad region, and a second end portion of the first subregion is connected to the first sub-pad region.

8. The pattern design of claim 1, wherein a first end portion of the second subregion is connected to the first sub-pad region, and a second end portion of the second subregion is connected to the second sub-pad region.

9. The pattern design of claim 1, wherein the second sub-pad region comprises a fourth sub-pad, a fifth sub-pad, and a sixth sub-pad, the fourth sub-pad is positioned at a first end portion of another branch line from among the plurality of first branch lines that extend from the first floating conductive line, the fifth sub-pad is positioned at a first end portion of another branch line from among the plurality of second branch lines that extend from the second floating conductive line, and the sixth sub-pad is positioned at another portion of the grounded conductive line that passes between the fourth sub-pad and the fifth sub-pad.

10. The pattern design of claim 1, wherein the plurality of main pads are larger than the first and second sub-pads.

11. A pattern design comprising:

a first comb line;

a second comb line; and a serpentine line disposed between the first comb line and the second comb line, wherein the first comb line comprises a first main line extending horizontally and a plurality of first branch lines extending perpendicularly from the first main line, the second comb line comprises a second main line extending horizontally and a plurality of second branch lines extending perpendicularly from the second main line, the serpentine line extends between the plurality of first branch lines and the plurality of second branch lines in a serpentine shape, the first comb line comprises a first main pad disposed at a first end portion of the first main line, and a plurality of first sub-pads respectively disposed at end portions of different single branch lines from among the plurality of first branch lines, the second comb line comprises a second main pad disposed at a first end portion of the second main line, and a plurality of second sub-pads respectively disposed at end portions of different single branch lines from among the plurality of second branch lines, the serpentine line comprises a third main pad disposed at a first end portion of the serpentine line and third sub-pads disposed between the plurality of first sub-pads and the plurality of second sub-pads, widths of the plurality of first sub-pads are larger than widths of the plurality of first branch lines, widths of the plurality of second sub-pads are larger than widths of the plurality of second branch lines, and widths of the third sub-pads are larger than a width of the serpentine line.

12. The pattern design of claim 11, wherein a second end portion of the serpentine line is grounded, and a second end portion of the first comb line and a second end portion of the second comb line are floating.

13. A pattern design comprising:

a first conductive line having a first main pad at a first end portion of the first conductive line;

a second conductive line having a second main pad at a first end portion of the second conductive line; and a third conductive line having a third main pad at a first end portion of the third conductive line, the third conductive line disposed between the first conductive line and the second conductive line, wherein the first conductive line comprising a first sub-pad positioned at an end portion of a branch line from among a plurality of first branch lines extending perpendicularly from the first conductive line toward the second conductive line, the second conductive line comprising a second sub-pad positioned at an end portion of a branch line from among a plurality of second branch lines extending perpendicularly from the second conductive line toward the first conductive line, the third conductive line comprising a third sub-pad disposed between the first sub-pad and the second sub-pad, and the first, second and third main pads are larger than the first, second and third sub-pads, and widths of the first, second and third sub-pads are larger than widths of the branch lines and a width of the third conductive line.

14. The pattern design of claim 13, wherein a second end portion of the first conductive line and a second end portion of the second conductive line are floating, and a second end of the third conductive line is grounded.

15. The pattern design of claim 13, wherein the third conductive line has a serpentine shape passing between the plurality of first branch lines and the plurality of second branch lines.

16. The pattern design of claim 13, wherein each of the first main pad, the second main pad and the third main pad comprise a conductive line of a lattice-type pattern.

* * * * *